(12) United States Patent
Su et al.

(10) Patent No.: US 9,786,790 B2
(45) Date of Patent: Oct. 10, 2017

(54) FLEXIBLE DEVICE

(71) Applicant: Industrial Technology Research Institute, Hsinchu (TW)

(72) Inventors: Ching-Wen Su, Changhua County (TW); Tai-Jui Wang, Kaohsiung (TW); Hsiao-Chiang Yao, Kaohsiung (TW); Tsu-Chiang Chang, New Taipei (TW); Bo-Yuan Su, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/062,222

(22) Filed: Mar. 7, 2016

(65) Prior Publication Data

US 2017/0170329 A1    Jun. 15, 2017

Related U.S. Application Data

(60) Provisional application No. 62/265,434, filed on Dec. 10, 2015.

(51) Int. Cl.
*H01L 29/78* (2006.01)
*H01L 29/786* (2006.01)
(Continued)

(52) U.S. Cl.
CPC ...... *H01L 29/78675* (2013.01); *H01L 21/324* (2013.01); *H01L 23/552* (2013.01)

(58) Field of Classification Search
CPC  H01L 29/78675; H01L 23/552; H01L 21/324
See application file for complete search history.

(56) References Cited

U.S. PATENT DOCUMENTS

| 6,413,645 B1 | 7/2002 | Graff et al. |
| 6,717,064 B1 | 4/2004 | Kurita et al. |

(Continued)

FOREIGN PATENT DOCUMENTS

| CN | 1401134 | 3/2003 |
| CN | 102664196 | 9/2012 |

(Continued)

OTHER PUBLICATIONS

Avila et al., "Biological Effects Produced by Intense Pulsed Light (Xe-CI) on the Cartilage of the Tongue Chick Embryo Using Various Filters," International Journal of Morphology, Sep. 2009, pp. 1003-1008.

(Continued)

*Primary Examiner* — Roy Potter
*Assistant Examiner* — Paul Patton
(74) *Attorney, Agent, or Firm* — Jianq Chyun IP Office

(57) ABSTRACT

In one embodiment, a flexible device is provided. The flexible device may include a flexible substrate, a buffer layer, a light reflective layer, and a device layer. The buffer layer is located on the flexible substrate. The light reflective layer is located on the flexible substrate, wherein the light reflective layer has a reflection wavelength of 200 nm~1100 nm, a reflection ratio of greater than 80%, and a stress direction of the light reflective layer is the same as a stress direction of the flexible substrate. The device layer is located on the light reflective layer and the buffer layer.

19 Claims, 13 Drawing Sheets

(51) Int. Cl.
*H01L 21/324* (2006.01)
*H01L 23/552* (2006.01)

(56) References Cited

U.S. PATENT DOCUMENTS

| | | |
|---|---|---|
| 6,794,277 B2 | 9/2004 | Machida et al. |
| 7,005,671 B2 | 2/2006 | Yamazaki et al. |
| 7,154,046 B2 | 12/2006 | Chung |
| 7,164,155 B2 | 1/2007 | Yamazaki et al. |
| 7,402,756 B2 | 7/2008 | Hoshino |
| 8,891,948 B2 | 11/2014 | Kusuda et al. |
| 9,236,420 B2 * | 1/2016 | Lee .................. H01L 51/56 |
| 2003/0077886 A1 | 4/2003 | Machida et al. |
| 2007/0085090 A1 | 4/2007 | Kim et al. |
| 2013/0203269 A1 | 8/2013 | Yokouchi |
| 2013/0260546 A1 | 10/2013 | Yamada et al. |
| 2016/0197293 A1 * | 7/2016 | Chen ................ H01L 21/02354 |
| | | 257/40 |

FOREIGN PATENT DOCUMENTS

| | | |
|---|---|---|
| TW | 201021634 | 6/2010 |
| TW | I397351 | 5/2013 |
| TW | I469359 | 1/2015 |
| TW | I471067 | 1/2015 |
| TW | I495091 | 8/2015 |

OTHER PUBLICATIONS

"Notice of Allowance of Taiwan Counterpart Application," dated May 17, 2017, p. 1-p. 5.

\* cited by examiner

FLEXIBLE DEVICE

CROSS-REFERENCE TO RELATED APPLICATION

This application claims the priority benefits of U.S. provisional application Ser. No. 62/265,434, filed on Dec. 10, 2015. The entirety of the above-mentioned patent application is hereby incorporated by reference herein and made a part of this specification.

BACKGROUND

1. Technical Field

The present disclosure generally relates to a flexible device.

2. Description of Related Art

Thermal annealing process may have been required during the manufacture of semiconductor materials. High energy light irradiation techniques such as infra-red lamp (IR-lamp) or flash lamp annealing (FLA) are used for the thermal annealing process. High energy light irradiation techniques may have the advantages of a low manufacturing temperature and reduces the manufacturing time.

When using high energy light irradiation techniques for the manufacture of flexible devices, it is possible that scorch of the flexible substrate may occur during thermal annealing. The flexible substrates may be made out of a material that can absorb a certain wavelength of light, wherein scorch of the flexible substrate may develop due to light absorption. In view of the above, how to prevent a scorch of the substrate during thermal annealing and to improve the quality of semiconductor products has become a focus in the related field.

SUMMARY

One embodiment of the disclosure provides a flexible device including a flexible substrate, a buffer layer, a light reflective layer, and a device layer. The buffer layer is located on the flexible substrate. The light reflective layer is located on the flexible substrate, wherein the light reflective layer has a reflection wavelength of 200 nm~1100 nm, a reflection ratio of greater than 80%, and a stress direction of the light reflective layer is the same as a stress direction of the flexible substrate. The device layer is located on the light reflective layer and the buffer layer.

In order to make the aforementioned disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
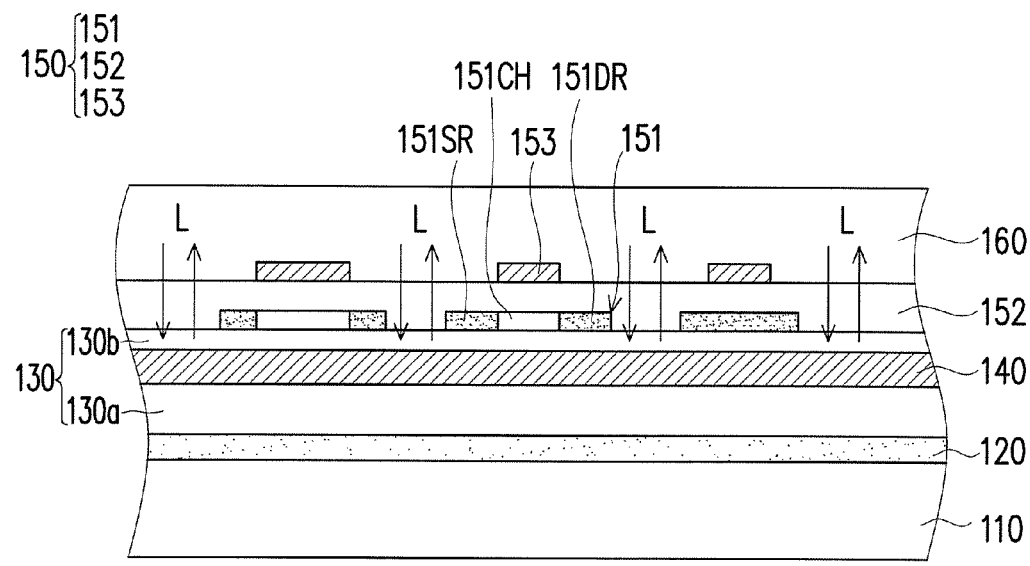
FIG. 1A is a schematic diagram illustrating a flexible device during a thermal annealing process according to embodiment one of the disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1A is a schematic diagram illustrating a flexible device during a thermal annealing process according to embodiment one of the disclosure. Referring to FIG. 1A, a flexible device may include a flexible substrate 110, a barrier layer 120, a buffer layer 130, a light reflective layer 140, a device layer 150 and a dielectric layer 160. The flexible substrate 110 may comprise organic materials such as polyimide, but is not particularly limited thereto. The barrier layer 120 is located on the flexible substrate 110, wherein the barrier layer 120 may comprise a plurality of oxide material layers and nitride material layers alternately stacked. The barrier layer 120 may be used to block the penetration of moisture and oxygen. The buffer layer 130 is located on the flexible substrate 110, wherein the buffer layer 130 is for example, made of a material having good thermal resistance, but is not particularly limited thereto.

In the present embodiment, a light reflective layer 140 is located on the flexible substrate 110, and more specifically, located within the buffer layer 130. The buffer layer 130 and the light reflective layer 140 are manufactured by disposing a first part layer 130a on the barrier layer 120, followed by disposing the light reflective layer 140 on top of the first part layer 130a. A second part layer 130b is disposed on the light reflective layer 140. Herein, the first part layer 130a and the second part layer 130b constitute the buffer layer 130. As such, the light reflective layer 140 is considered to be located within the buffer layer 130.

The light reflective layer 140 may have a reflection wavelength of 200 nm~1100 nm, a reflection ratio of greater than 80%, and a stress direction of the light reflective layer 140 is the same as a stress direction of the flexible substrate 110. Herein, the stress direction refers to the type of stress received by the light reflective layer 140 and the flexible substrate 110. For instance, the layers may receive tensile stress having positive stress values or compressive stress having negative stress values. In the present embodiment, the light reflective layer 140 and the flexible substrate 110 both receive compressive stress, meaning that they both have the same stress direction. Further, a total compressive stress received by both layers is less than −500 MPa. A peeling of the layers may be prevented.

Additionally, the light reflective layer 140 may comprise a metal layer, a stacked layer comprising a metal layer and a ceramic layer, a stacked layer comprising a first ceramic layer, a metal layer and a second ceramic layer, or a combination thereof. In the layers defined above, when the light reflective layer 140 comprises a metal material, then the metal material may comprise Rh, Al, AlNd, Cu, Au, Ag, Al alloy, Rh alloy, or a combination thereof. Moreover, when the light reflective layer 140 further comprises a ceramic material, then the ceramic material may comprise an oxide material, a nitride material or a combination thereof. Herein, the ceramic material has a transmittance ratio of greater than 30% at a wavelength range of 200 nm-1100 nm. In an embodiment, the light reflective layer 140 is a stacked layer comprising a first ceramic layer, a metal layer and a second ceramic layer. The metal layer may have sandwiched between the first ceramic layer and the second ceramic layer, and wherein the first ceramic layer and the second ceramic layer are made of oxide, nitride, dopant oxide, or mixed oxide, such as indium tin oxide (ITO), indium oxide ($In_2O_3$), tin oxide ($SnO_2$), zinc oxide (ZnO), cadmium oxide (CdO), titanium nitride (TiN), indium zinc oxide (IZO), gallium zinc oxide (GZO), aluminum zinc oxide (AZO), fluorium zinc oxide (ZnO:F), fluorium tin oxide ($SnO_2$:F), tantaium titanium oxide ($TiO_2$:Ta), $In_2O_3$—ZnO, $CdIn_2O_4$, $Cd_2SnO_4$, and $Zn_2SnO_4$. The light reflective layer 140 will have the desired reflection properties. However, it should be noted that the layers in the light reflective layer 140 is not particularly limited, and various combinations of the metal layer and ceramic layer can be made.

In FIG. 1A, the device layer 150 is located on the light reflective layer 140 and the buffer layer 130. The device layer 150 may comprise a polysilicon layer 151, a gate insulating layer 152 and a gate electrode 153. Herein, the polysilicon layer 151 comprises a source region 151SR, a drain region 151DR and a channel region 151CH that is located in between the source region 151SR and the drain region 151DR. The gate insulating layer 152 is located on the polysilicon layer 151 and covers the source region 151SR, the drain region 151DR and the channel region 151CH. The gate electrode 153 is located on the gate insulating layer 152. Further, a dielectric layer 160 is located on the device layer 150, and covers the gate electrode 153.

During a thermal annealing process shown in FIG. 1A, for example, by using infra-red lamp (IR-lamp) or flash lamp annealing (FLA) for thermal annealing, a light L is irradiated onto the flexible device for the activation of materials located in the device layer 150 and dielectric layer 160. The irradiated light L may pass through the gate insulating layer 152 and dielectric layer 160 to reach the light reflective layer 140, wherein the light L is reflected back towards the device layer 150 and dielectric layer 160. An activation of the layers and an efficiency of the thermal annealing process may be improved. Furthermore, as the light reflective layer 140 acts to reflect the irradiated light L, a scorch on the flexible substrate 110 may be prevented, and the flexible device may be manufactured with higher quality.

Figure 1B:
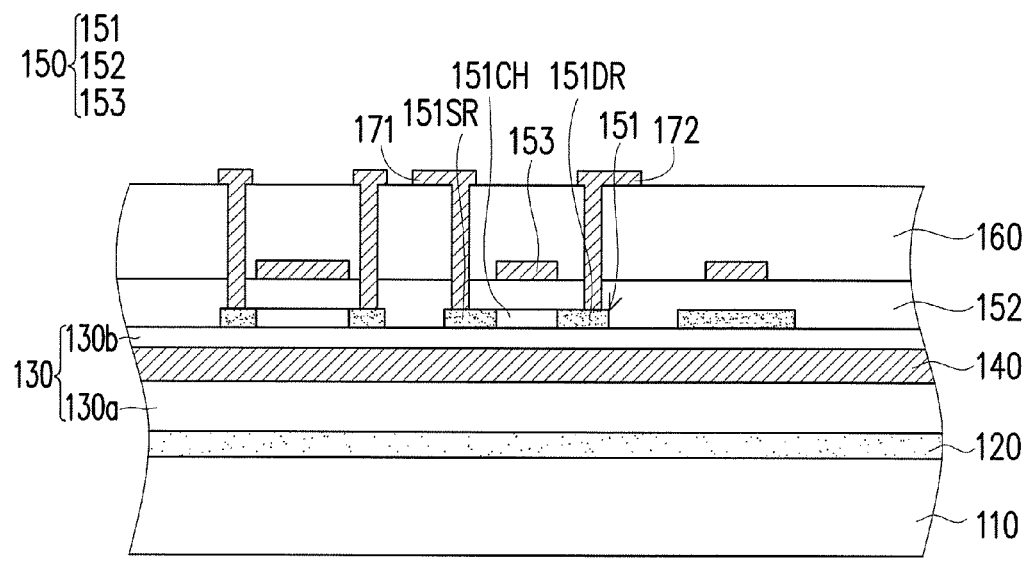
FIG. 1B is a schematic diagram illustrating a product of the flexible device in FIG. 1A after the thermal annealing process.

FIG. 1B is a schematic diagram illustrating a product of the flexible device in FIG. 1A after the thermal annealing process. After completion of the thermal annealing process, a source electrode 171 and a drain electrode 172 are disposed on the dielectric layer 160. The source electrode 171 and the drain electrode 172 passes through the openings in the dielectric layer 160 and the gate insulating layer 152 so as to electrically connect with the source region 151SR and the drain region 151DR of the polysilicon layer 151. In FIG. 1B, the device layer 150, the dielectric layer 160, the source electrode 171 and the drain electrode 172 constitute an active device (ex. thin film transistor). In the present embodiment, two active devices are shown in the middle and the left part of the flexible device in FIG. 1B. Furthermore, towards the right of the active devices may further include a storage capacitor. However, it should be noted that the flexible device of the disclosure is not limited thereto, and may include a plurality of active devices and storage capacitors.

In the embodiment shown in FIG. 1A and FIG. 1B above, the light reflective layer 140 is located within the buffer layer 130. However, the present disclosure is not limited thereto, and the position and pattern of the light reflective layer 140 may be varied. The different embodiments of a flexible device in the disclosure will be described in the following paragraphs. The embodiments presented below shows a flexible device during a thermal annealing process. However, after the thermal annealing process, the flexible device in these embodiments can be further modified, for example, disposing the source and drain electrodes by referring to the embodiment shown in FIG. 1B.

Figure 2:
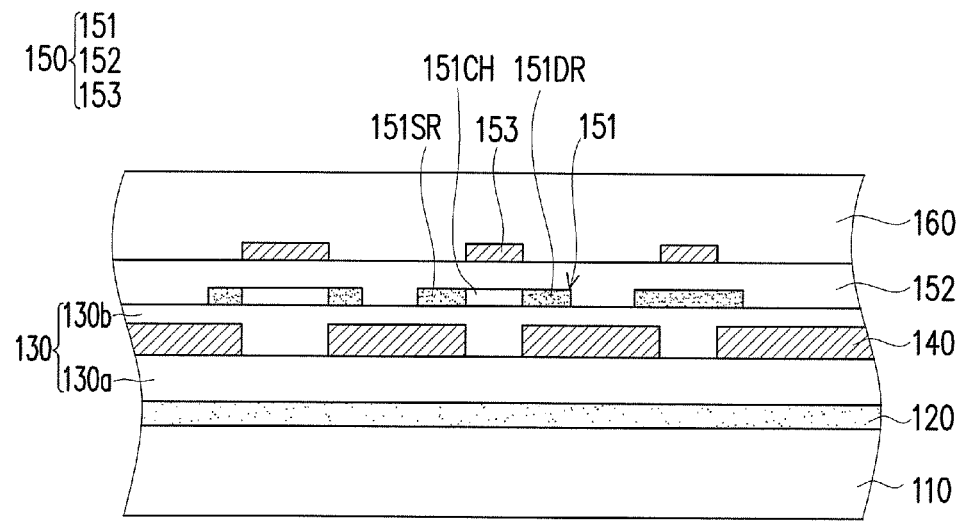
FIG. 2 is a schematic diagram illustrating a flexible device during a thermal annealing process according to embodiment two of the disclosure.

FIG. 2 is a schematic diagram illustrating a flexible device during a thermal annealing process according to embodiment two of the disclosure. The flexible device of embodiment two is similar to the flexible device shown in FIG. 1A, therefore, the same reference numbers are used to refer to the same or like parts, and its related description will not be repeated herein. The flexible device shown in FIG. 2, the light reflective layer 140 is a patterned light reflective layer 140. In the present embodiment, the buffer layer 130 and the light reflective layer 140 are manufactured by disposing a first part layer 130a on the barrier layer 120, followed by disposing the light reflective layer 140 on top of the first part layer 130a. The light reflective layer 140 is then patterned to form a patterned light reflective layer 140, wherein the patterned light reflective layer 140 does not overlap with the gate electrode 153 of the device layer 150. A parasitic capacitance between the light reflective layer 140 and the gate electrode 153 may be reduced. A second part layer 130b is disposed on the patterned light reflective layer 140. Herein, the first part layer 130a and the second part layer 130b constitute the buffer layer 130. As such, the light reflective layer 140 is considered to be located within the buffer layer 130.

Similarly, in embodiment two, the irradiated light may pass through the gate insulating layer 152 and dielectric layer 160 to reach the light reflective layer 140, wherein the light L is reflected back towards the device layer 150 and dielectric layer 160. An activation of the layers and an efficiency of the thermal annealing process may be improved. Furthermore, as the light reflective layer 140 acts to reflect the irradiated light L, a scorch on the flexible substrate 110 may be prevented, and the flexible device may be manufactured with higher quality.

Figure 3:
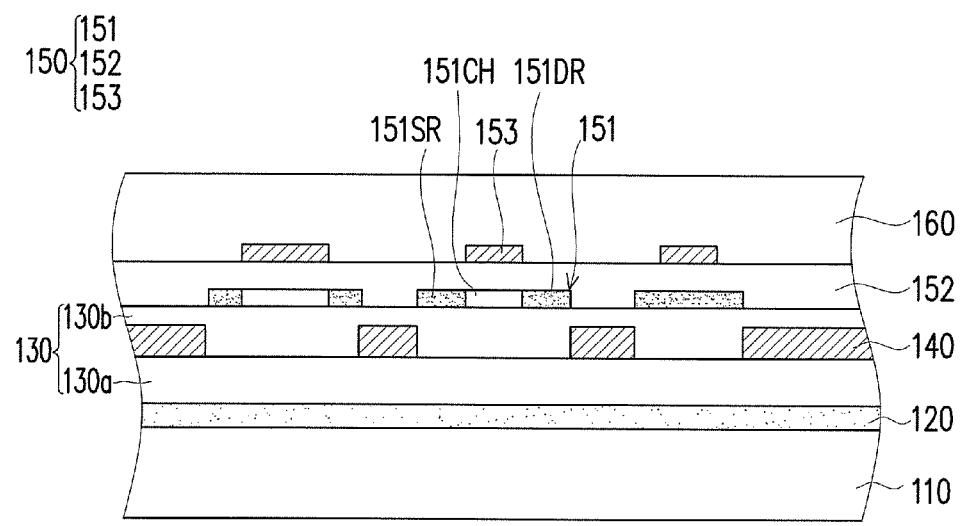
FIG. 3 is a schematic diagram illustrating a flexible device during a thermal annealing process according to embodiment three of the disclosure.

FIG. 3 is a schematic diagram illustrating a flexible device during a thermal annealing process according to embodiment three of the disclosure. The flexible device of embodiment three is similar to the flexible device shown in FIG. 2, therefore, the same reference numbers are used to refer to the same or like parts, and its related description will not be repeated herein. The flexible device shown in FIG. 3, the light reflective layer 140 is a patterned light reflective layer 140, and that the patterned light reflective layer 140 does not overlap with the polysilicon layer 151 of the device layer 150. A parasitic capacitance of the flexible device may be further reduced, and the performance of the flexible device improved.

Similarly, in embodiment three, a light reflective layer 140 is included. An activation of the layers and an efficiency of the thermal annealing process may be improved. Furthermore, as the light reflective layer 140 acts to reflect the irradiated light L, a scorch on the flexible substrate 110 may be prevented, and the flexible device may be manufactured with higher quality.

Figure 4:
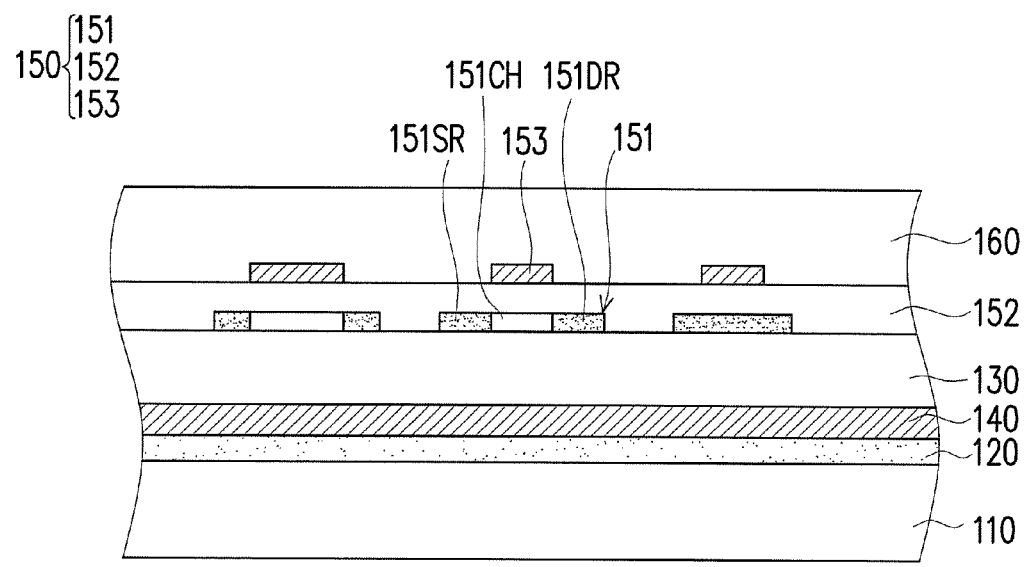
FIG. 4 is a schematic diagram illustrating a flexible device during a thermal annealing process according to embodiment four of the disclosure.

FIG. 4 is a schematic diagram illustrating a flexible device during a thermal annealing process according to embodiment four of the disclosure. The flexible device of embodiment four is similar to the flexible device shown in FIG. 1A, therefore, the same reference numbers are used to refer to the same or like parts, and its related description will not be repeated herein. In the present embodiment, the light reflective layer 140 is located above the barrier layer 120, such that the light reflective layer 140 is contacting the barrier layer 120. Further, the light reflective layer 140 is located in between the barrier layer 120 and the buffer layer 130.

Similarly, in embodiment four, a light reflective layer 140 is included. An activation of the layers and an efficiency of the thermal annealing process may be improved. Furthermore, as the light reflective layer 140 acts to reflect the irradiated light L, a scorch on the flexible substrate 110 may be prevented, and the flexible device may be manufactured with higher quality.

Figure 5:
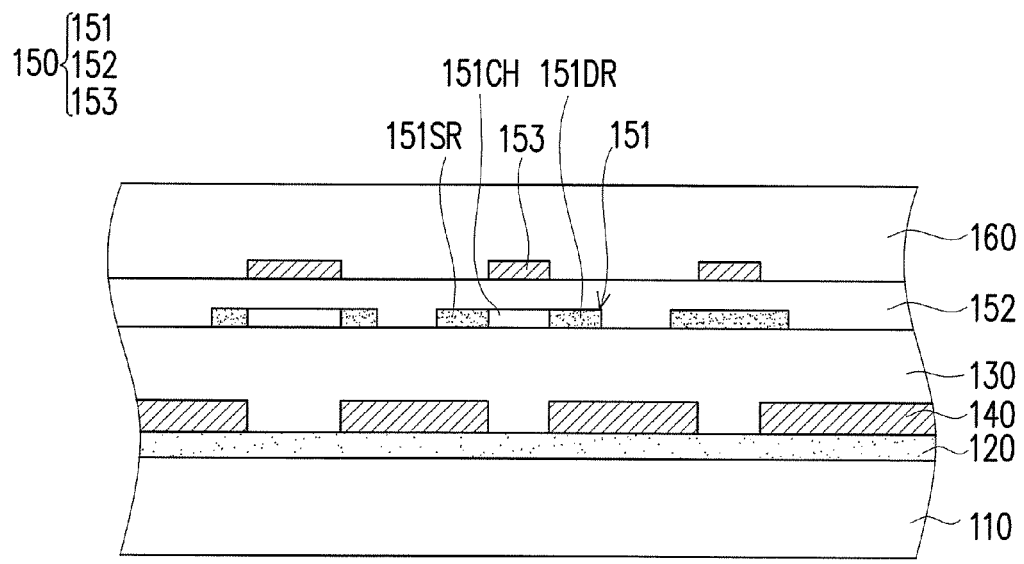
FIG. 5 is a schematic diagram illustrating a flexible device during a thermal annealing process according to embodiment five of the disclosure.

FIG. 5 is a schematic diagram illustrating a flexible device during a thermal annealing process according to embodiment five of the disclosure. The flexible device of embodiment five is similar to the flexible device shown in FIG. 4, therefore, the same reference numbers are used to refer to the same or like parts, and its related description will not be repeated herein. The flexible device shown in FIG. 5, the light reflective layer 140 is a patterned light reflective layer 140, and that the patterned light reflective layer 140 does not overlap with a gate electrode 153 of the device layer 150. A parasitic capacitance between the light reflective layer 140 and the gate electrode 153 may be reduced, and the performance of the flexible device improved.

Similarly, in embodiment five, a light reflective layer 140 is included. An activation of the layers and an efficiency of the thermal annealing process may be improved. Furthermore, as the light reflective layer 140 acts to reflect the irradiated light L, a scorch on the flexible substrate 110 may be prevented, and the flexible device may be manufactured with higher quality.

Figure 6:
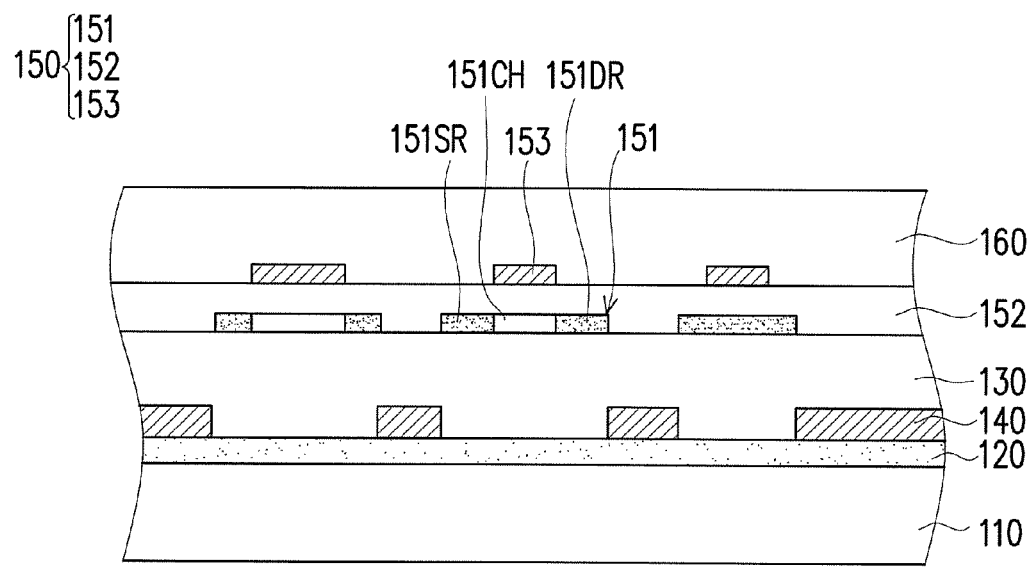
FIG. 6 is a schematic diagram illustrating a flexible device during a thermal annealing process according to embodiment six of the disclosure.

FIG. 6 is a schematic diagram illustrating a flexible device during a thermal annealing process according to embodiment six of the disclosure. The flexible device of embodiment six is similar to the flexible device shown in FIG. 5, therefore, the same reference numbers are used to refer to the same or like parts, and its related description will not be repeated herein. The flexible device shown in FIG. 6, the light reflective layer 140 is a patterned light reflective layer 140, and that the patterned light reflective layer 140 does not overlap with the polysilicon layer 151 of the device layer 150. A parasitic capacitance of the flexible device may be further reduced, and the performance of the flexible device improved.

Similarly, in embodiment six, a light reflective layer 140 is included. An activation of the layers and an efficiency of the thermal annealing process may be improved. Furthermore, as the light reflective layer 140 acts to reflect the irradiated light L, a scorch on the flexible substrate 110 may be prevented, and the flexible device may be manufactured with higher quality.

Figure 7:
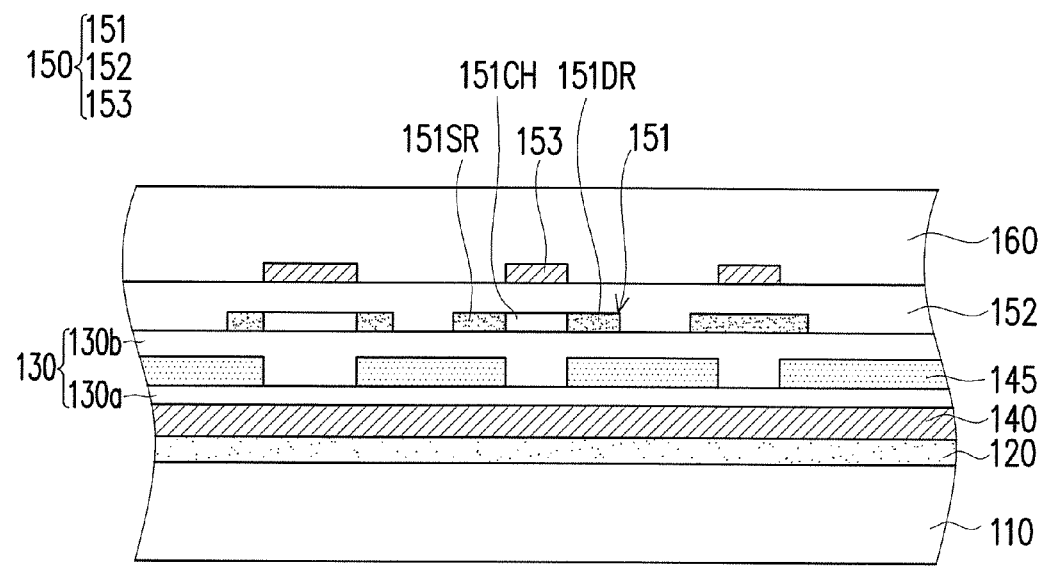
FIG. 7 is a schematic diagram illustrating a flexible device during a thermal annealing process according to embodiment seven of the disclosure.

FIG. 7 is a schematic diagram illustrating a flexible device during a thermal annealing process according to embodiment seven of the disclosure. The flexible device of embodiment seven is similar to the flexible device shown in FIG. 4, therefore, the same reference numbers are used to refer to the same or like parts, and its related description will not be repeated herein. The flexible device shown in FIG. 7, further includes light absorbing film 145, wherein the light absorbing film 145 is located above the light reflection layer 140.

Herein, a material of the light absorbing film 145 may comprise amorphous Si, microcrystalline Si, Mo, Ti, Cr, W, Zr, V, Nb, Ta, Pt, Cu, Au, Zn, Cd, Al, Ag, C, Sn, or a combination thereof. The light absorbing film 145 may have a band gap range between 1.1 eV~1.8 eV, but is not limited thereto. In an embodiment, the light absorbing film 145 may be a multilayered structure, wherein the multilayered structure comprises stacked layers of different band gap materials (e.g. high band gap materials and low band gap materials). In the present embodiment, the buffer layer 130, the light reflective layer 140 and the light absorbing film 145 are manufactured by disposing the light reflective layer 140 on the barrier layer 120. A first part layer 130a was then disposed on the light reflective layer 140, and the light absorbing film 145 was disposed on the first part layer 130a and is patterned. The patterned light absorbing film 145 does not overlap with a gate electrode 153 of the device layer 150, a parasitic capacitance may be reduced, and the performance of the flexible device improved. A second part layer 130b is disposed on the patterned light absorbing film 145. The first part layer 130a and the second part layer 130b constitute the buffer layer 130. Therefore, the light absorbing film 145 is located within the buffer layer 130 and is separated from the light reflective layer 140. The light absorbing film 145 may act to absorb the reflected light by the light reflective layer 140, hence, preventing undesired light interactions in the flexible device.

Similarly, in embodiment seven, a light reflective layer 140 is included. An activation of the layers and an efficiency of the thermal annealing process may be improved. Furthermore, as the light reflective layer 140 may prevent a scorch of the flexible substrate 110, the flexible device may be manufactured with higher quality.

In another embodiment, the position and pattern of the light reflective layer 140 and the light absorbing film 145 in embodiment seven (FIG. 7) may be switched. For instance, the buffer layer 130, the light reflective layer 140 and the light absorbing film 145 are manufactured by disposing the light absorbing film 145 on the barrier layer 120. A first part layer 130a was then disposed on the light absorbing film 145, and the light reflective layer 140 was disposed on the first part layer 130a and is patterned. The patterned light reflective layer 140 does not overlap with the gate electrode 153 of the device layer 150, a parasitic capacitance may be reduced, and the performance of the flexible device improved. A second part layer 130b is disposed on the patterned light reflective layer 140. As such, the patterned light reflective layer 140 is manufactured to be located on the light absorbing film 145. Similarly, in such embodiment, as the light reflective layer 140 may prevent a scorch of the flexible substrate 110, the flexible device may be manufactured with higher quality.

Figure 8:
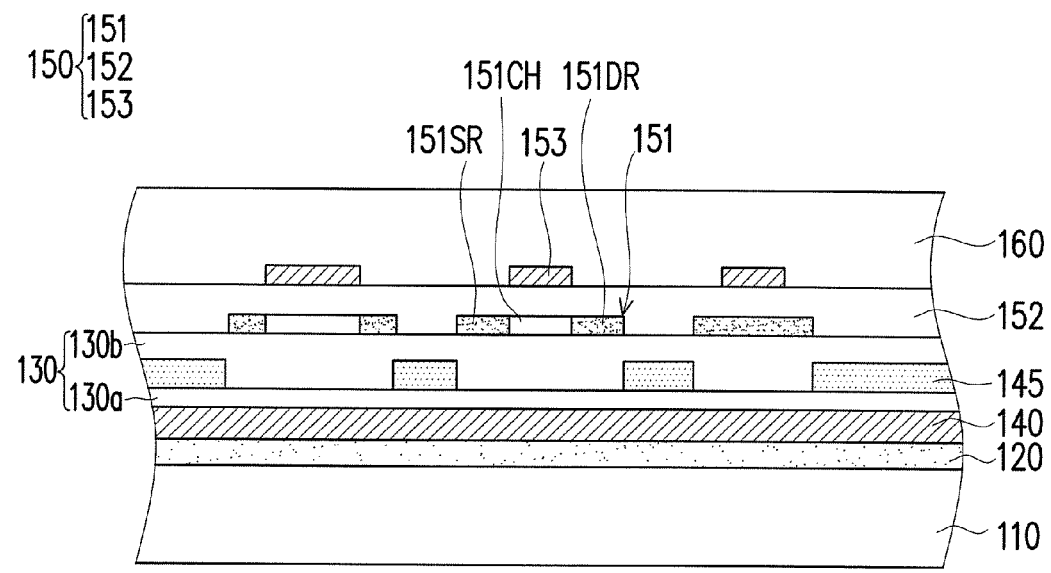
FIG. 8 is a schematic diagram illustrating a flexible device during a thermal annealing process according to embodiment eight of the disclosure.

FIG. 8 is a schematic diagram illustrating a flexible device during a thermal annealing process according to embodiment eight of the disclosure. The flexible device of embodiment eight is similar to the flexible device shown in FIG. 7, therefore, the same reference numbers are used to refer to the same or like parts, and its related description will not be repeated herein. The flexible device shown in FIG. 8, the light absorbing film 145 is a patterned light absorbing film 145, and that the patterned light absorbing film 145 does not overlap with the polysilicon layer 151 of the device layer 150. A parasitic capacitance of the flexible device may be further reduced, and the performance of the flexible device improved.

Similarly, in embodiment eight, a light absorbing film 145 is included. The light absorbing film 145 may act to absorb the reflected light by the light reflective layer 140, hence, preventing any undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment eight (FIG. 8) may be switched. For instance, the light absorbing film 145 is disposed on the barrier layer 120. The light reflective layer 140 is located within the buffer layer 130 and disposed on the light absorbing film 145. The light reflective layer 140 is a patterned light reflective layer 140, wherein the patterned light reflective layer 140 does not overlap with the polysilicon layer 151 of the device layer 150. A parasitic capacitance of the flexible device may be further reduced, and the performance of the flexible device improved. Similarly, in such embodiment, as the light reflective layer 140 may prevent a scorch of the flexible substrate 110, the flexible device may be manufactured with higher quality.

Figure 9:
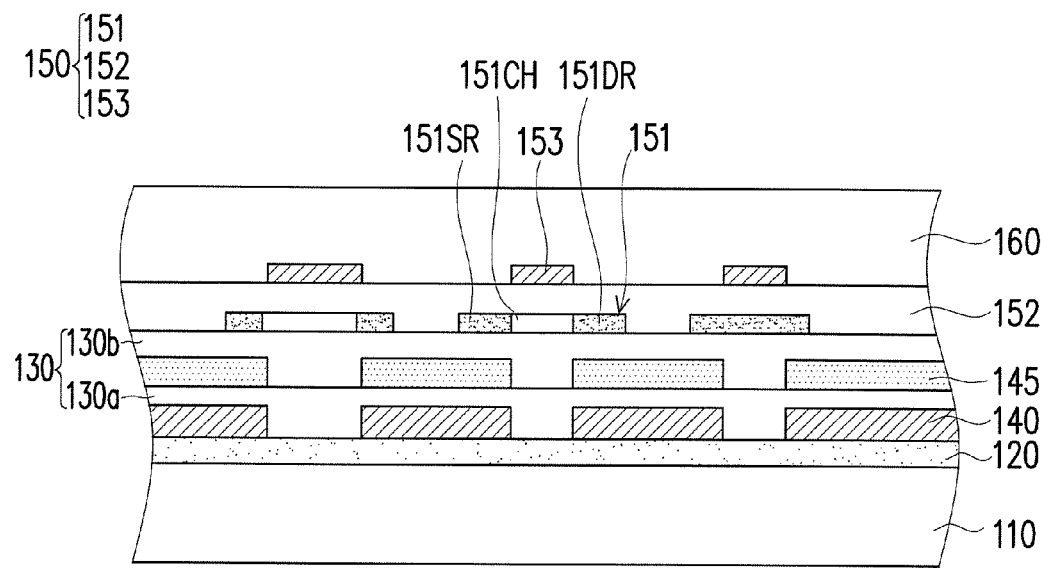
FIG. 9 is a schematic diagram illustrating a flexible device during a thermal annealing process according to embodiment nine of the disclosure.

FIG. 9 is a schematic diagram illustrating a flexible device during a thermal annealing process according to embodiment nine of the disclosure. The flexible device of embodiment nine is similar to the flexible device shown in FIG. 7, therefore, the same reference numbers are used to refer to the same or like parts, and its related description will not be repeated herein. The flexible device shown in FIG. 9, the light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the gate electrode 153 of the device layer 150. A parasitic capacitance may be reduced and the performance of the flexible device improved.

Similarly, in embodiment nine, a light absorbing film 145 is included. The light absorbing film 145 may act to absorb the reflected light by the light reflective layer 140, hence, preventing any undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment nine (FIG. 9) may be switched. For instance, the light absorbing film 145 is disposed on the barrier layer 120. The light reflective layer 140 is located within the buffer layer 130 and disposed on the light absorbing film 145. The light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the gate electrode 153 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 10:
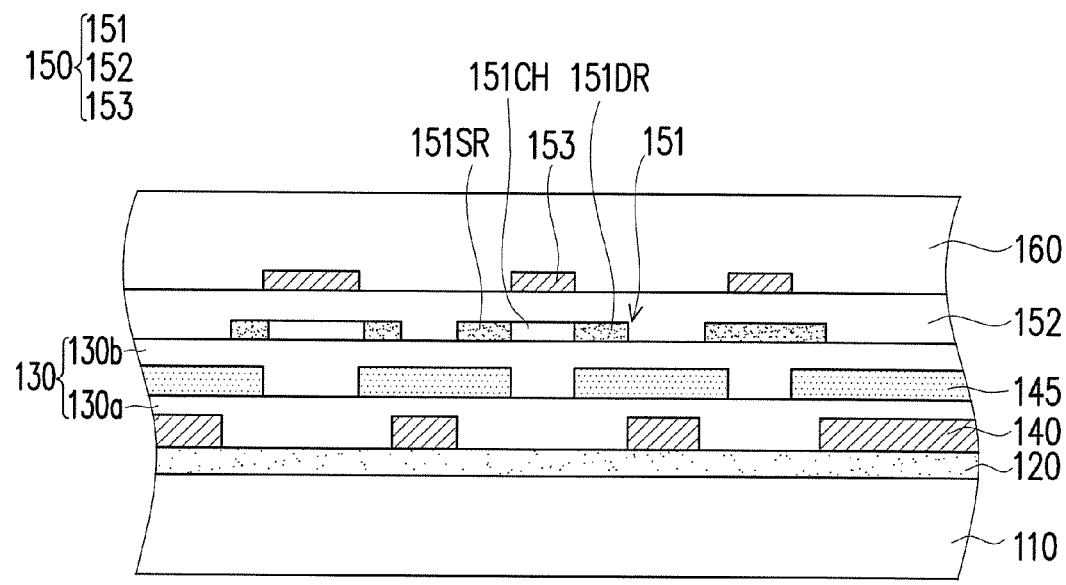
FIG. 10 is a schematic diagram illustrating a flexible device during a thermal annealing process according to embodiment ten of the disclosure.

FIG. 10 is a schematic diagram illustrating a flexible device during a thermal annealing process according to embodiment ten of the disclosure. The flexible device of embodiment ten is similar to the flexible device shown in FIG. 7, therefore, the same reference numbers are used to refer to the same or like parts, and its related description will not be repeated herein. The flexible device shown in FIG. 10, the light reflective layer 140 is a patterned light reflective layer 140 and the light absorbing film 145 is a patterned light absorbing film 145. The patterned light reflective layer 140 and the patterned light absorbing film 145 have different pattern. Herein, the light reflective layer 140 does not overlap with the polysilicon layer 151, whereas the light absorbing film 145 does not overlap with the gate electrode 153 of the device layer 150. A parasitic capacitance may be reduced and the performance of the flexible device improved.

Similarly, in embodiment ten, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment ten (FIG. 10) may be switched. For instance, the light absorbing film 145 is disposed on the barrier layer 120. The light reflective layer 140 is located within the buffer layer 130 and disposed on the light absorbing film 145. The light reflective layer 140 is a patterned light reflective layer 140 and the light absorbing film 145 is a patterned light absorbing film 145. The patterned light reflective layer 140 and the patterned light absorbing film 145 have different pattern. Herein, the light absorbing film 145 does not overlap with the polysilicon layer 151, whereas the light reflective layer 140 does not overlap with the gate electrode 153 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 11:
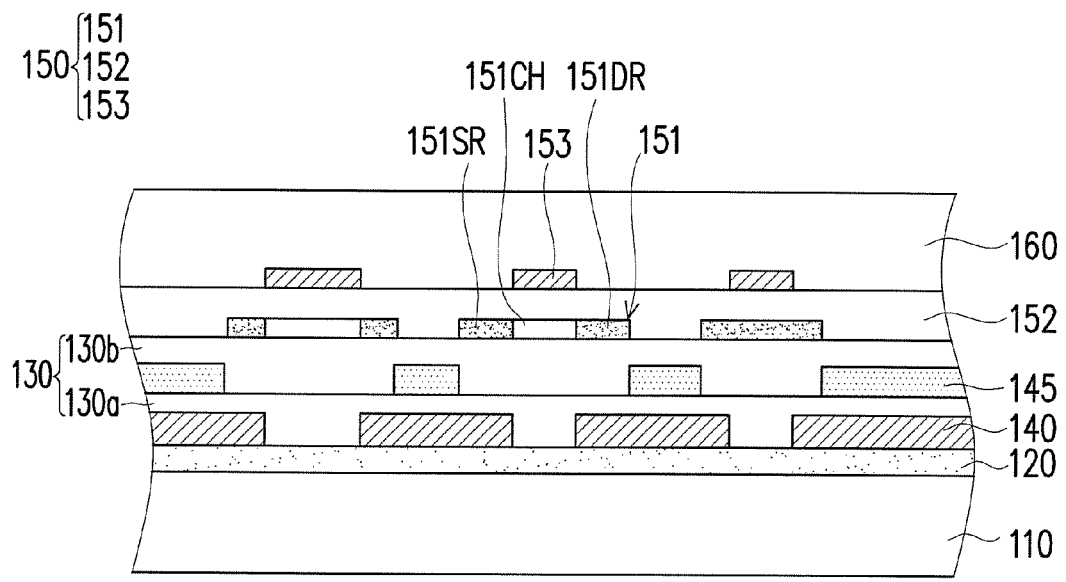
FIG. 11 is a schematic diagram illustrating a flexible device during a thermal annealing process according to embodiment eleven of the disclosure.

FIG. 11 is a schematic diagram illustrating a flexible device during a thermal annealing process according to embodiment eleven of the disclosure. The flexible device of embodiment eleven is similar to the flexible device shown in FIG. 10, therefore, the same reference numbers are used to refer to the same or like parts, and its related description will not be repeated herein. The flexible device shown in FIG. 11, the light reflective layer 140 is a patterned light reflective layer 140 and the light absorbing film 145 is a patterned light absorbing film 145. The patterned light reflective layer 140 and the patterned light absorbing film 145 have different pattern. The light reflective layer 140 does not overlap with the gate electrode 153, whereas the light absorbing film 145 does not overlap with the polysilicon layer 151 of the device layer 150. A parasitic capacitance may be reduced and the performance of the flexible device improved.

Similarly, in embodiment eleven, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment eleven (FIG. 11) may be switched. For instance, the light absorbing film 145 is disposed on the barrier layer 120. The light reflective layer 140 is located within the buffer layer 130 and disposed on the light absorbing film 145. The light reflective layer 140 is a patterned light reflective layer 140 and the light absorbing film 145 is a patterned light absorbing film 145. The patterned light reflective layer 140 and the patterned light absorbing film 145 have different pattern. The light absorbing film 145 does not overlap with the gate electrode 153, whereas the light reflective layer 140 does not overlap with the polysilicon layer 151 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 12:
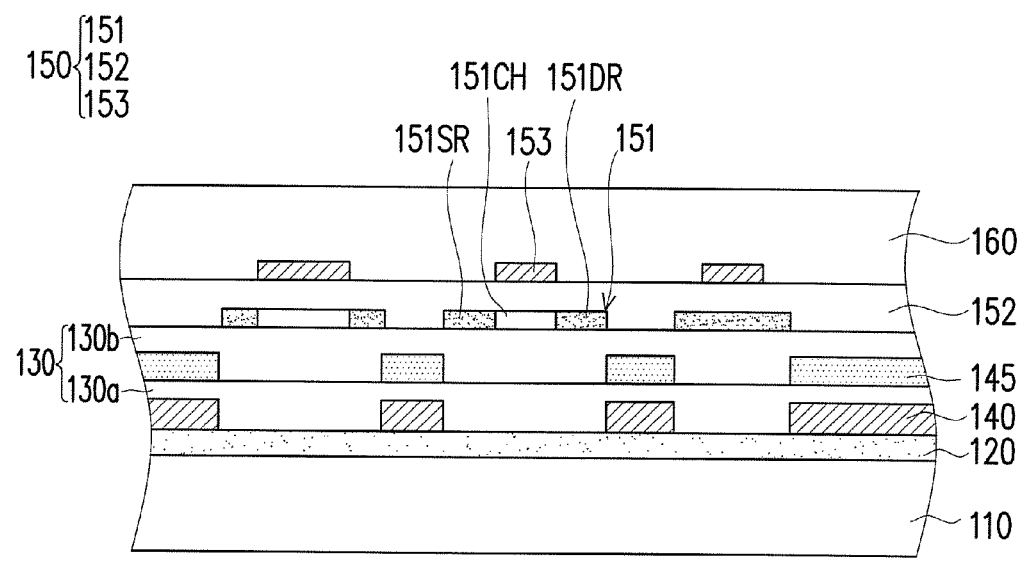
FIG. 12 is a schematic diagram illustrating a flexible device during a thermal annealing process according to embodiment twelve of the disclosure.

FIG. 12 is a schematic diagram illustrating a flexible device during a thermal annealing process according to embodiment twelve of the disclosure. The flexible device of embodiment twelve is similar to the flexible device shown in FIG. 9, therefore, the same reference numbers are used to refer to the same or like parts, and its related description will not be repeated herein. The flexible device shown in FIG. 12, the light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the polysilicon layer 151 of the device layer 150. A parasitic capacitance may be reduced and the performance of the flexible device improved.

Similarly, in embodiment twelve, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment twelve (FIG. 12) may be switched. For instance, the light absorbing film 145 is disposed on the barrier layer 120. The light reflective layer 140 is located within the buffer layer 130 and disposed on the light absorbing film 145. The light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the polysilicon layer 151 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 13:
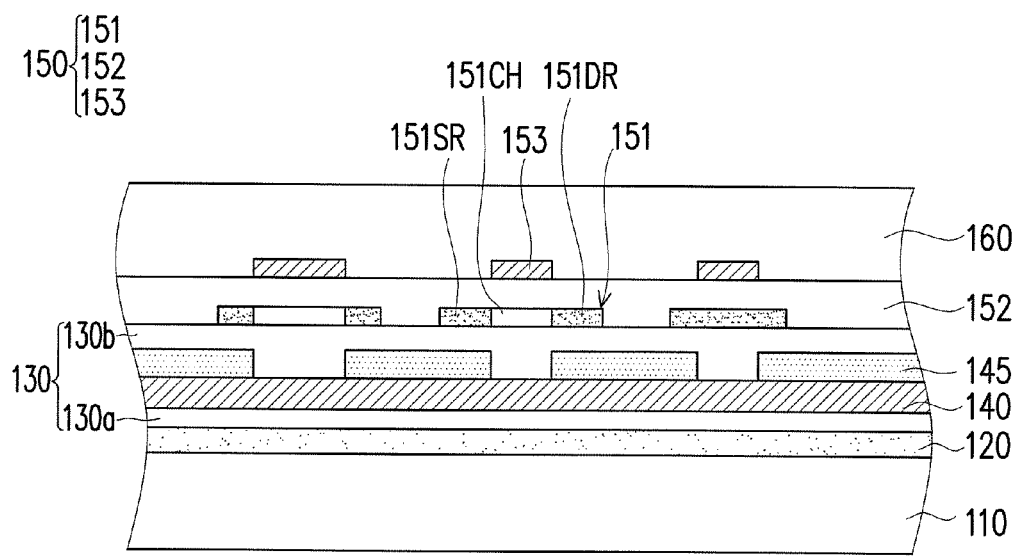
FIG. 13 is a schematic diagram illustrating a flexible device during a thermal annealing process according to embodiment thirteen of the disclosure.

FIG. 13 is a schematic diagram illustrating a flexible device during a thermal annealing process according to embodiment thirteen of the disclosure. The flexible device of embodiment thirteen is similar to the flexible device shown in FIG. 7, therefore, the same reference numbers are used to refer to the same or like parts, and its related description will not be repeated herein.

In the present embodiment, the buffer layer 130, the light reflective layer 140 and the light absorbing film 145 are manufactured by disposing a first part layer 130a on the barrier layer 120. The light reflective layer 140 was then disposed on the first part layer 130a, and the light absorbing film 145 was disposed on the light reflective layer 140 and is patterned. The patterned light absorbing film 145 does not overlap with the gate electrode 153 of the device layer 150, a parasitic capacitance may be reduced, and the performance of the flexible device improved. A second part layer 130b is disposed on the patterned light absorbing film 145. The first part layer 130a and the second part layer 130b constitute the buffer layer 130. Therefore, the light reflective layer 140 and the light absorbing film 145 is located within the buffer layer 130, and that the light absorbing film 145 may be in contact with the light reflective layer 140.

Similarly, in embodiment thirteen, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment thirteen (FIG. 13) may be switched. For instance, the light reflective layer 140 and the light absorbing film 145 are manufactured by disposing a first part layer 130a on the barrier layer 120. The light absorbing film 145 was then disposed on the first part layer 130a, and the light reflective layer 140 was disposed on the light absorbing film 145 and is patterned. The patterned light reflective layer 140 does not overlap with the gate electrode 153 of the device layer 150, a parasitic capacitance may be reduced, and the performance of the flexible device improved. A second part layer 130b is disposed on the patterned light reflective layer 140. Therefore, the light reflective layer 140 and the light absorbing film 145 is located within the buffer layer 130, and that the light reflective layer 140 may be in contact with the light absorbing film 145. Similarly, in such embodiment, as the light reflective layer 140 may prevent a scorch of the flexible substrate 110, the flexible device may be manufactured with higher quality.

Figure 14:
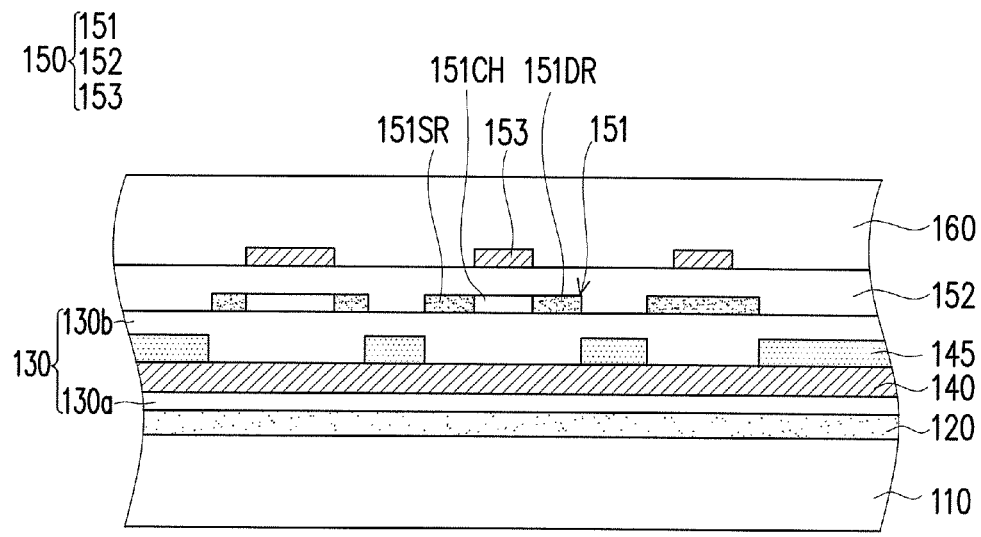
FIG. 14 is a schematic diagram illustrating a flexible device during a thermal annealing process according to embodiment fourteen of the disclosure.

FIG. 14 is a schematic diagram illustrating a flexible device during a thermal annealing process according to embodiment fourteen of the disclosure. The flexible device of embodiment fourteen is similar to the flexible device shown in FIG. 13, therefore, the same reference numbers are used to refer to the same or like parts, and its related description will not be repeated herein. The flexible device shown in FIG. 14, the light absorbing film 145 is a patterned light absorbing film 145, and that the patterned light absorbing film 145 does not overlap with the polysilicon layer 151 of the device layer 150. A parasitic capacitance of the flexible device may be further reduced, and the performance of the flexible device improved.

Similarly, in embodiment fourteen, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment fourteen (FIG. 14) may be switched. For instance, the light reflective layer 140 and the light absorbing film 145 is located within the buffer layer 130, and that the light reflective layer 140 may be in contact with the light absorbing film 145. The light reflective layer 140 is located on the light absorbing film 145 and is patterned. The patterned light reflective layer 140 does not overlap with the polysilicon layer 151 of the device layer 150. A parasitic capacitance of the flexible device may be further reduced, and the performance of the flexible device improved. Similarly, in such embodiment, as the light reflective layer 140 may prevent a scorch of the flexible substrate 110, the flexible device may be manufactured with higher quality.

Figure 15:
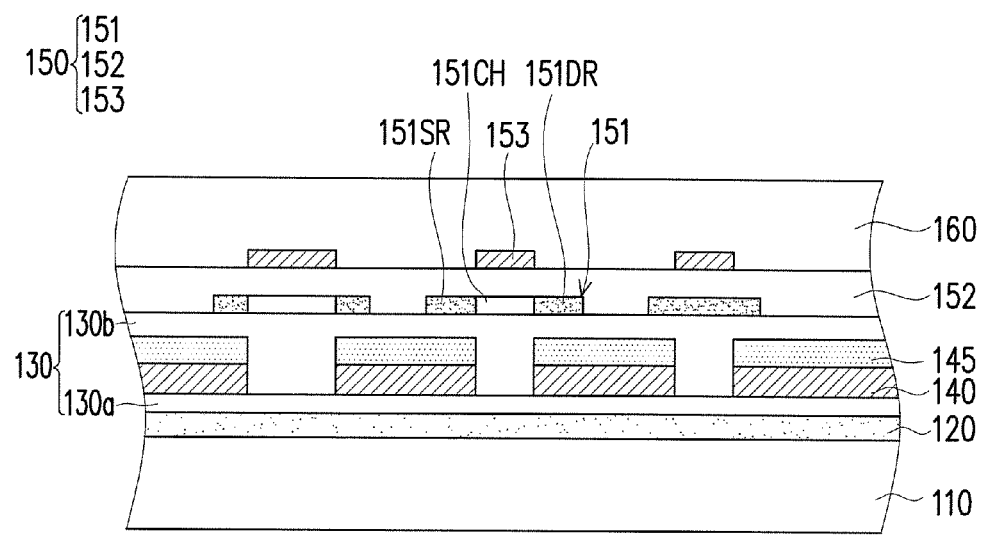
FIG. 15 is a schematic diagram illustrating a flexible device during a thermal annealing process according to embodiment fifteen of the disclosure.

FIG. 15 is a schematic diagram illustrating a flexible device during a thermal annealing process according to embodiment fifteen of the disclosure. The flexible device of embodiment fifteen is similar to the flexible device shown in FIG. 13, therefore, the same reference numbers are used to refer to the same or like parts, and its related description will not be repeated herein. The flexible device shown in FIG. 15, the light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the gate electrode 153 of the device layer 150. A parasitic capacitance may be reduced and the performance of the flexible device improved.

Similarly, in embodiment fifteen, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment fifteen (FIG. 15) may be switched. For instance, the light reflective layer 140 and the light absorbing film 145 is located within the buffer layer 130, and that the light reflective layer 140 may be in contact with the light absorbing film 145. The light reflective layer 140 is located on the light absorbing film 145. The light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the gate electrode 153 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 16:
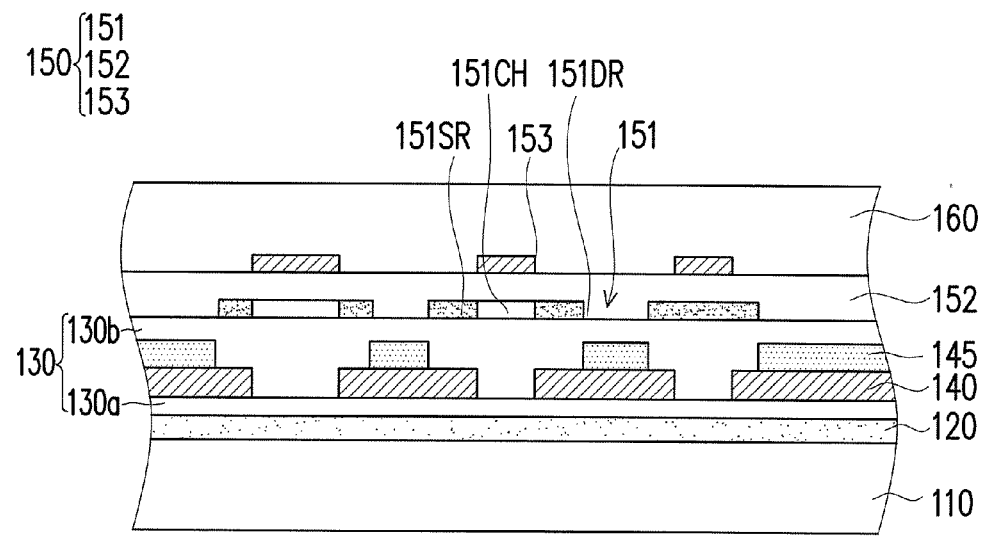
FIG. 16 is a schematic diagram illustrating a flexible device during a thermal annealing process according to embodiment sixteen of the disclosure.

FIG. 16 is a schematic diagram illustrating a flexible device during a thermal annealing process according to embodiment sixteen of the disclosure. The flexible device of embodiment sixteen is similar to the flexible device shown in FIG. 13, therefore, the same reference numbers are used to refer to the same or like parts, and its related description will not be repeated herein. The flexible device shown in FIG. 16, the light reflective layer 140 is a patterned light reflective layer 140 and the light absorbing film 145 is a patterned light absorbing film 145. The patterned light reflective layer 140 and the patterned light absorbing film 145 have different pattern. Herein, the light reflective layer 140 does not overlap with the gate electrode 153, whereas the light absorbing film 145 does not overlap with the polysilicon layer 151 of the device layer 150. A parasitic capacitance may be reduced and the performance of the flexible device improved.

Similarly, in embodiment sixteen, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment sixteen (FIG. 16) may be switched. For instance, the light reflective layer 140 and the light absorbing film 145 is located within the buffer layer 130, and that the light reflective layer 140 may be in contact with the light absorbing film 145. The light reflective layer 140 is located on the light absorbing film 145. The light reflective layer 140 is a patterned light reflective layer 140 and the light absorbing film 145 is a patterned light absorbing film 145. The patterned light reflective layer 140 and the patterned light absorbing film 145 have different pattern. Herein, the light absorbing film 145 does not overlap with the gate electrode 153, whereas the light reflective layer 140 does not overlap with the polysilicon layer 151 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 17:
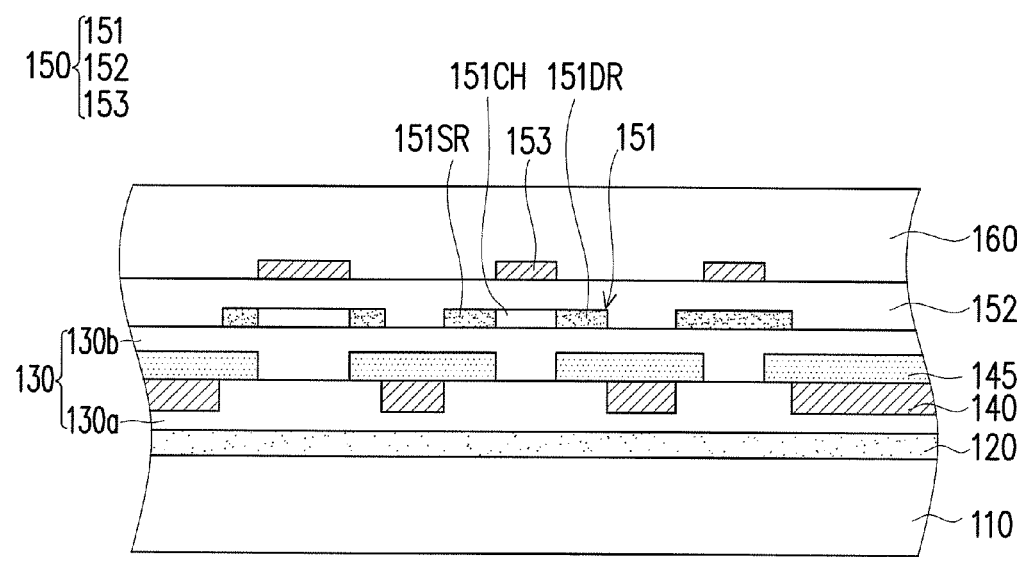
FIG. 17 is a schematic diagram illustrating a flexible device during a thermal annealing process according to embodiment seventeen of the disclosure.

FIG. 17 is a schematic diagram illustrating a flexible device during a thermal annealing process according to embodiment seventeen of the disclosure. The flexible device of embodiment seventeen is similar to the flexible device shown in FIG. 16, therefore, the same reference numbers are used to refer to the same or like parts, and its related description will not be repeated herein. The flexible device shown in FIG. 17, the light reflective layer 140 is a patterned light reflective layer 140 and the light absorbing film 145 is a patterned light absorbing film 145. The patterned light reflective layer 140 and the patterned light absorbing film 145 have different pattern. Herein, the light reflective layer 140 does not overlap with the polysilicon layer 151, whereas the light absorbing film 145 does not overlap with the gate electrode 153 of the device layer 150. A parasitic capacitance may be reduced and the performance of the flexible device improved. In the present embodiment, the buffer layer 130, the light reflective layer 140 and the light absorbing film 145 are manufactured by disposing a first part layer 130a on the s barrier layer 120, and patterning the first part layer 130a. The light reflective layer 140 is disposed inside the patterned first part layer 130a, and then the light absorbing film 145 is disposed on the light reflective layer 140 and is patterned. A second part layer 130b is disposed on the light absorbing film 145. Herein, the first part layer 130a and the second part layer 130b constitute the buffer layer 130. The light reflective layer 140 and the light absorbing film 145 are located within the buffer layer 130.

Similarly, in embodiment seventeen, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment seventeen (FIG. 17) may be switched. For instance, the light reflective layer 140 and the light absorbing film 145 is located within the buffer layer 130, and that the light reflective layer 140 may be in contact with the light absorbing film 145. The light reflective layer 140 is located on the light absorbing film 145. The light reflective layer 140 is a patterned light reflective layer 140 and the light absorbing film 145 is a patterned light absorbing film 145. The patterned light reflective layer 140 and the patterned light absorbing film 145 have different pattern. Herein, the light absorbing film 145 does not overlap with the polysilicon layer 151, whereas the light reflective layer 140 does not overlap with the gate electrode 153 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 18:
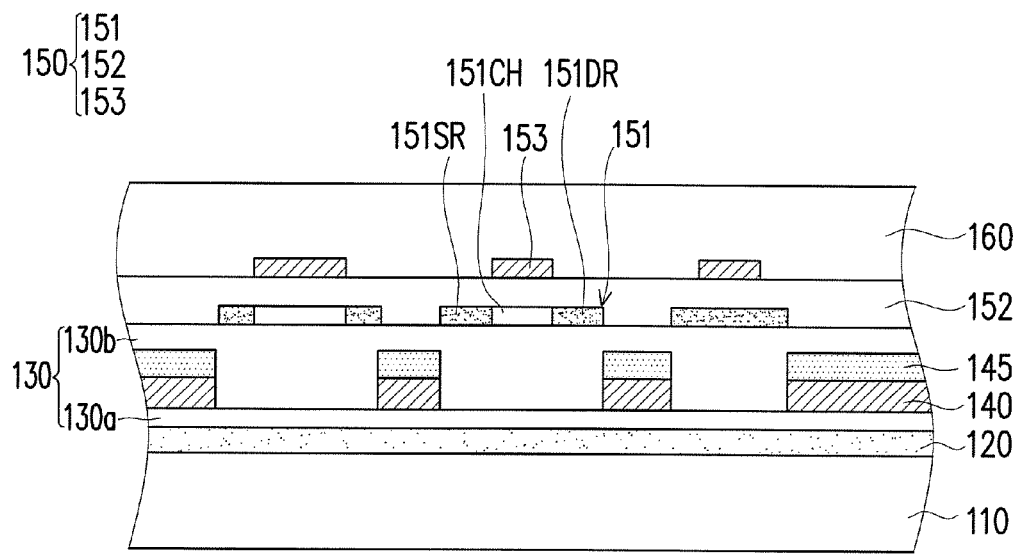
FIG. 18 is a schematic diagram illustrating a flexible device during a thermal annealing process according to embodiment eighteen of the disclosure.

FIG. 18 is a schematic diagram illustrating a flexible device during a thermal annealing process according to embodiment eighteen of the disclosure. The flexible device of embodiment eighteen is similar to the flexible device shown in FIG. 15, therefore, the same reference numbers are used to refer to the same or like parts, and its related description will not be repeated herein. The flexible device shown in FIG. 18, the light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the polysilicon layer 151 of the device layer 150. A parasitic capacitance may be reduced and the performance of the flexible device improved.

Similarly, in embodiment eighteen, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment eighteen (FIG. 18) may be switched. For instance, the light reflective layer 140 and the light absorbing film 145 is located within the buffer layer 130, and that the light reflective layer 140 may be in contact with the light absorbing film 145. The light reflective layer 140 is located on the light absorbing film 145. The light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the polysilicon layer 151 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 19:
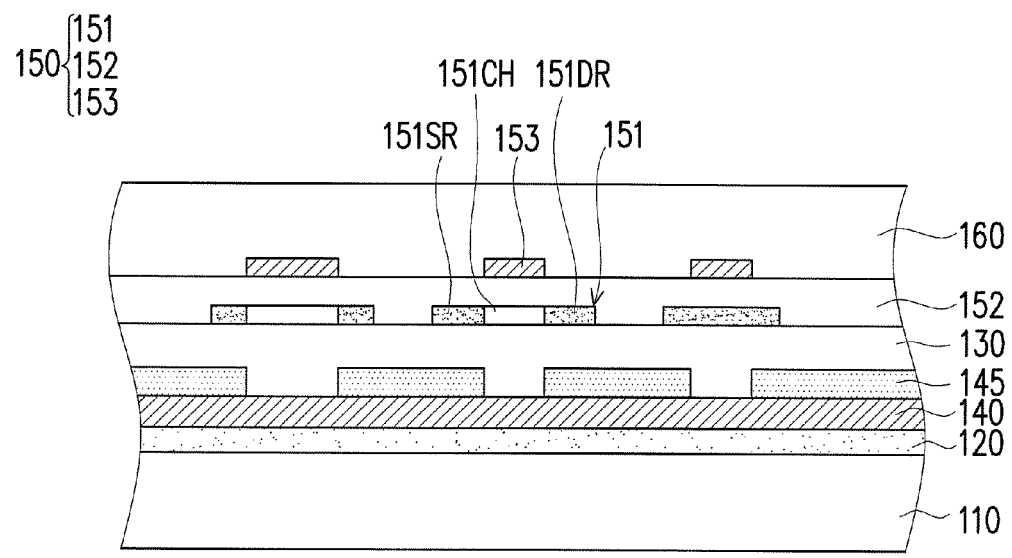
FIG. 19 is a schematic diagram illustrating a flexible device during a thermal annealing process according to embodiment nineteen of the disclosure.

FIG. 19 is a schematic diagram illustrating a flexible device during a thermal annealing process according to embodiment nineteen of the disclosure. The flexible device of embodiment nineteen is similar to the flexible device shown in FIG. 7, therefore, the same reference numbers are used to refer to the same or like parts, and its related description will not be repeated herein. The flexible device shown in FIG. 19, the light absorbing film 145 may be in contact with the light reflective layer 140. In the present embodiment, the buffer layer 130, the light reflective layer 140 and the light absorbing film 145 are manufactured by first disposing the light reflective layer 140 on the barrier layer 120, followed by disposing the patterned light absorbing film 145 on the light reflective layer 140. The buffer layer 130 is disposed on the light absorbing film 145, and fills into the patterned openings of the light absorbing film 145. As such, the light absorbing film 145 may be considered as located within the buffer layer 130.

Similarly, in embodiment nineteen, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment nineteen (FIG. 19) may be switched. For instance, the buffer layer 130, the light reflective layer 140 and the light absorbing film 145 are manufactured by first disposing the light absorbing film 145 on the barrier layer 120, followed by disposing the patterned light reflective layer 140 on the light absorbing film 145. The buffer layer 130 is disposed on the light reflective layer 140, and fills into the patterned openings of the light reflective layer 140. The light reflective layer 140 may be in contact with the light absorbing film 145, and the light reflective layer 140 may be considered as located within the buffer layer 130. Herein, the patterned light reflective layer 140 does not overlap with the gate electrode 153 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 20:
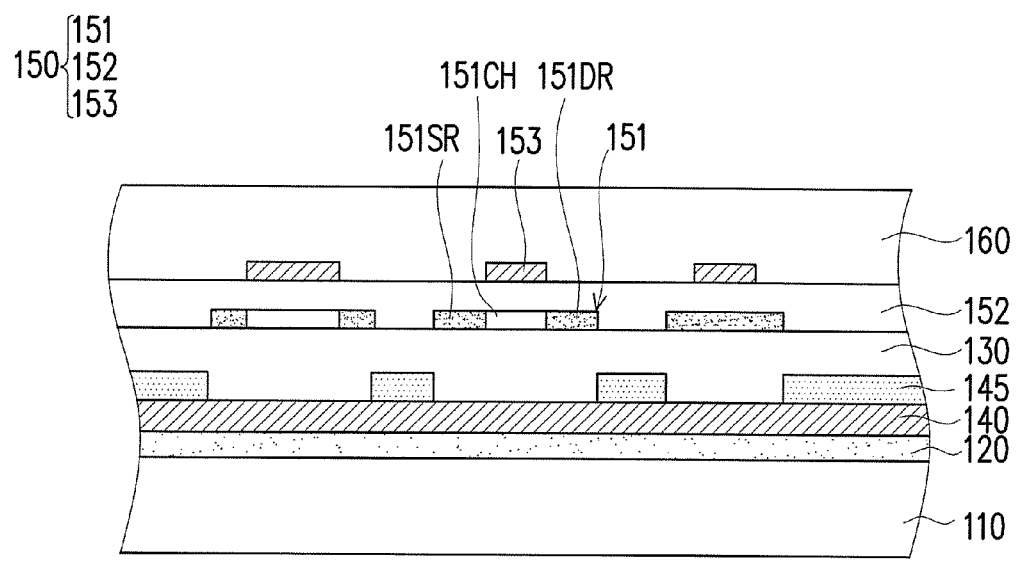
FIG. 20 is a schematic diagram illustrating a flexible device during a thermal annealing process according to embodiment twenty of the disclosure.

FIG. 20 is a schematic diagram illustrating a flexible device during a thermal annealing process according to embodiment twenty of the disclosure. The flexible device of embodiment twenty is similar to the flexible device shown in FIG. 19, therefore, the same reference numbers are used to refer to the same or like parts, and its related description will not be repeated herein. The flexible device shown in FIG. 20, the light absorbing film 145 is a patterned light absorbing film 145, and that the patterned light absorbing film 145 does not overlap with the polysilicon layer 151 of the device layer 150. A parasitic capacitance of the flexible device may be further reduced, and the performance of the flexible device improved.

Similarly, in embodiment twenty, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment twenty (FIG. 20) may be switched. For instance, the light reflective layer 140 is located within the buffer layer 130 and may be in contact with the light absorbing film 145. The light reflective layer 140 is located on the light absorbing film 145 and is a patterned light reflective layer 140. The patterned light reflective layer 140 does not overlap with the polysilicon layer 151 of the device layer 150. A parasitic capacitance of the flexible device may be further reduced, and the performance of the flexible device improved. Similarly, in such embodiment, as the light reflective layer 140 may prevent a scorch of the flexible substrate 110, the flexible device may be manufactured with higher quality.

Figure 21:
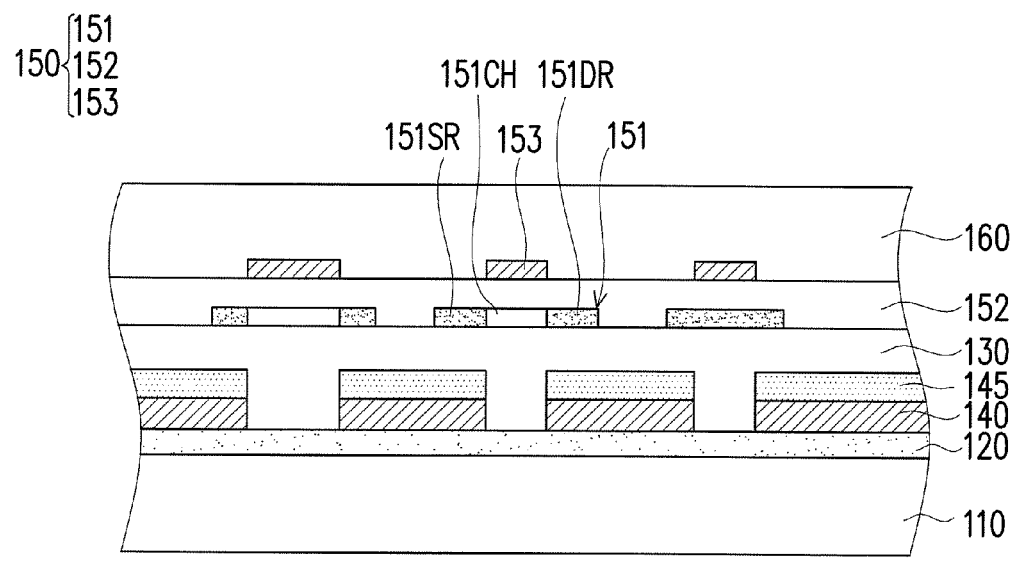
FIG. 21 is a schematic diagram illustrating a flexible device during a thermal annealing process according to embodiment twenty-one of the disclosure.

FIG. 21 is a schematic diagram illustrating a flexible device during a thermal annealing process according to embodiment twenty-one of the disclosure. The flexible device of embodiment twenty-one is similar to the flexible device shown in FIG. 19, therefore, the same reference numbers are used to refer to the same or like parts, and its related description will not be repeated herein. The flexible device shown in FIG. 21, the light reflective layer 140 is a patterned light reflective layer 140 and the light absorbing film 145 is a patterned light absorbing film 145. The patterned light reflective layer 140 and the patterned light absorbing film 145 have the same pattern and may be in contact with each other. Herein, the patterned light reflective layer 140 and the light absorbing film 145 do not overlap with the gate electrode 153 of the device layer 150. A parasitic capacitance may be reduced and the performance of the flexible device improved.

Similarly, in embodiment twenty-one, a light absorbing film 145 is included. Therefore, the light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment twenty-one (FIG. 21) may be switched. For instance, the light reflective layer 140 is located within the buffer layer 130 and may be in contact with the light absorbing film 145. The light reflective layer 140 is located on the light absorbing film 145. The light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the gate electrode 153 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 22:
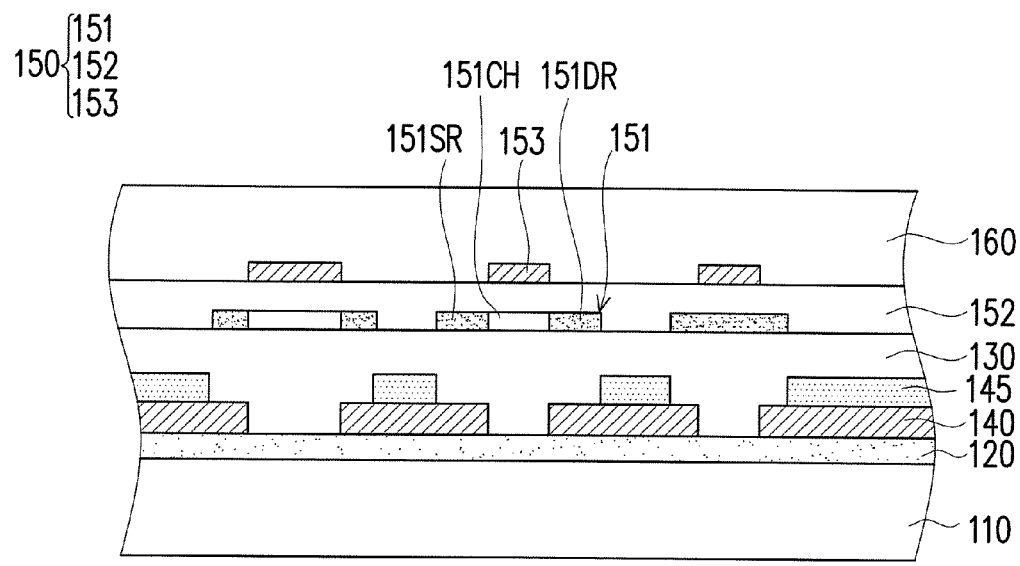
FIG. 22 is a schematic diagram illustrating a flexible device during a thermal annealing process according to embodiment twenty-two of the disclosure.

FIG. 22 is a schematic diagram illustrating a flexible device during a thermal annealing process according to embodiment twenty-two of the disclosure. The flexible device shown in FIG. 22, a the light reflective layer 140 is a patterned light reflective layer 140 and the light absorbing film 145 is a patterned light absorbing film 145. The patterned light reflective layer 140 and the patterned light absorbing film 145 have different pattern. Herein, the light reflective layer 140 does not overlap with the gate electrode 153, whereas the light absorbing film 145 does not overlap with the polysilicon layer 151 of the device layer 150. A parasitic capacitance may be reduced and the performance of the flexible device improved.

Similarly, in embodiment twenty-two, a light absorbing film 145 is included. Therefore, the light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment twenty-two (FIG. 22) may be switched. For instance, the light reflective layer 140 is located within the buffer layer 130 and may be in contact with the light absorbing film 145. The light reflective layer 140 is located on the light absorbing film 145. The light reflective layer 140 is a patterned light reflective layer 140 and the light absorbing film 145 is a patterned light absorbing film 145. The patterned light reflective layer 140 and the patterned light absorbing film 145 have different pattern. Herein, the light absorbing film 145 does not overlap with the gate electrode 153, whereas the light reflective layer 140 does not overlap with the polysilicon layer 151 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 23:
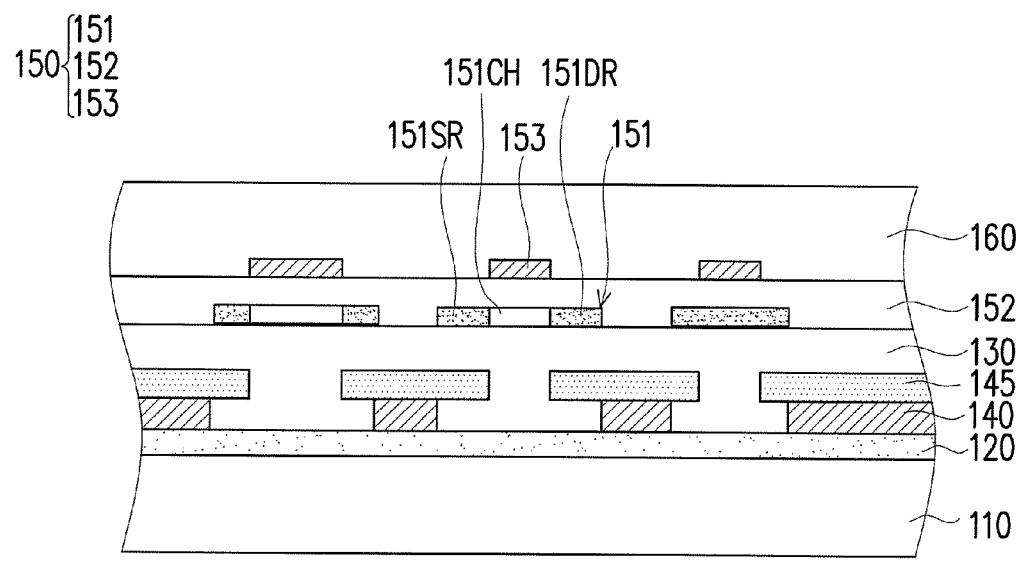
FIG. 23 is a schematic diagram illustrating a flexible device during a thermal annealing process according to embodiment twenty-three of the disclosure.

FIG. 23 is a schematic diagram illustrating a flexible device during a thermal annealing process according to embodiment twenty-three of the disclosure. The flexible device of embodiment twenty-three is similar to the flexible device shown in FIG. 22, therefore, the same reference numbers are used to refer to the same or like parts, and its related description will not be repeated herein. The flexible device shown in FIG. 23, the light reflective layer 140 is a patterned light reflective layer 140 and the light absorbing film 145 is a patterned light absorbing film 145. The patterned light reflective layer 140 and the patterned light absorbing film 145 have different pattern. The light reflective layer 140 does not overlap with the polysilicon layer 151, whereas the light absorbing film 145 does not overlap with the gate electrode 153 of the device layer 150. A parasitic capacitance may be reduced and the performance of the flexible device improved.

Similarly, in embodiment twenty-three, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment twenty-three (FIG. 23) may be switched. For instance, the light reflective layer 140 is located within the buffer layer 130 and may be in contact with the light absorbing film 145. The light reflective layer 140 is located on the light absorbing film 145. The light reflective layer 140 is a patterned light reflective layer 140 and the light absorbing film 145 is a patterned light absorbing film 145. The patterned light reflective layer 140 and the patterned light absorbing film 145 have different pattern. The light absorbing film 145 does not overlap with the polysilicon layer 151, whereas the light reflective layer 140 does not overlap with the gate electrode 153 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

Figure 24:
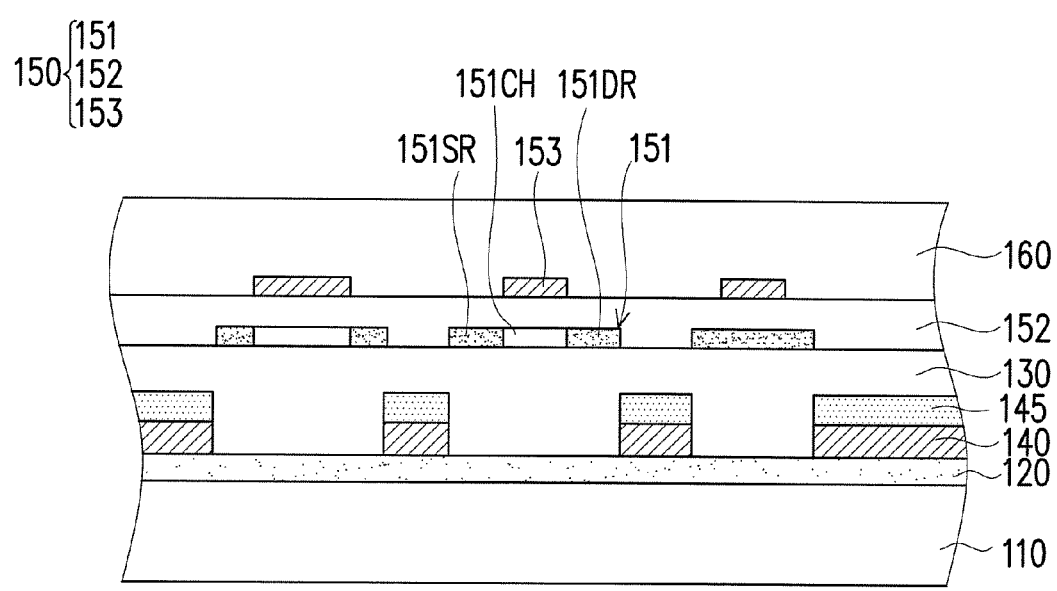
FIG. 24 is a schematic diagram illustrating a flexible device during a thermal annealing process according to embodiment twenty-four of the disclosure.

FIG. 24 is a schematic diagram illustrating a flexible device during a thermal annealing process according to embodiment twenty-four of the disclosure. The flexible device of embodiment twenty-four is similar to the flexible device shown in FIG. 21, therefore, the same reference numbers are used to refer to the same or like parts, and its related description will not be repeated herein. The flexible device shown in FIG. 24, the light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the polysilicon layer 151 of the device layer 150. A parasitic capacitance may be reduced and the performance of the flexible device improved.

Similarly, in embodiment twenty-four, a light absorbing film 145 is included. The light absorbing film 145 may act to absorb the reflected light by the light reflective layer 140, hence, preventing undesired light interactions in the flexible device. Furthermore, a light reflective layer 140 is included. An activation of the layers and an efficiency of the thermal annealing process may be improved. Additionally, as the light reflective layer 140 may prevent a scorch of the flexible substrate 110, the flexible device may be manufactured with higher quality.

In another embodiment, the position and pattern of the light reflective layer 140 and the light absorbing film 145 in embodiment twenty-four (FIG. 24) may be switched. For instance, the light reflective layer 140 is located within the buffer layer 130 and may be in contact with the light absorbing film 145. The light reflective layer 140 is located on the light absorbing film 145. The light reflective layer 140 is a patterned light reflective layer 140 and the light absorbing film 145 is a patterned light absorbing film 145. The patterned light reflective layer 140 and the patterned light absorbing film 145 have the same pattern. Herein, the patterned light reflective layer 140 and the light absorbing film 145 do not overlap with the polysilicon layer 151 of the device layer 150. A parasitic capacitance may be reduced and the performance of the flexible device improved. Similarly, in such embodiment, as the light reflective layer 140 may prevent a scorch of the flexible substrate 110, the flexible device may be manufactured with higher quality.

In some embodiments, the flexible device of the present disclosure may include a light reflective layer, wherein the light reflective layer has a particular reflection wavelength and reflection ratio. The flexible device may reflect the light caused by light irradiation during thermal annealing. In other words, the efficiency of the thermal annealing process may be improved, and a scorch of the substrate may be prevented. Furthermore, a light absorbing film may be included, which may act to absorb the reflected light by the light reflective layer, and prevent the undesired light interactions in the flexible device. Moreover, when the light reflective layer and the light absorbing film are patterned such that they do not overlap with the gate electrode or the polysilicon layer of the device layer, a parasitic capacitance may be reduced and the performance of the flexible device improved.

It will be clear that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A flexible device, comprising:
   a flexible substrate;
   a buffer layer located on the flexible substrate;
   a light reflective layer located on the flexible substrate, the light reflective layer has a reflection wavelength of 200 nm~1100 nm, a reflection ratio of greater than 80%, a stress direction of the light reflective layer is the same as a stress direction of the flexible substrate, wherein the light reflective layer comprises a metal material and a ceramic material, the ceramic material comprises an oxide material, a nitride material or a combination thereof, and the ceramic material has a transmittance ratio of greater than 30% at a wavelength range of 200-1100 nm; and
   a device layer located on the light reflective layer and the buffer layer, wherein the light reflective layer is located between the flexible substrate and the device layer.

2. The flexible device according to claim 1, wherein the light reflective layer is located within the buffer layer.

3. The flexible device according to claim 2, wherein the light reflective layer is a patterned light reflective layer, and the patterned light reflective layer does not overlap with a gate electrode of the device layer or does not overlap with a polysilicon layer of the device layer.

4. The flexible device according to claim 1, further comprising a barrier layer, wherein the light reflective layer is located above the barrier layer and in between the barrier layer and the buffer layer.

5. The flexible device according to claim 4, wherein the light reflective layer is a patterned light reflective layer, and the patterned light reflective layer does not overlap with a gate electrode of the device layer.

6. The flexible device according to claim 4, wherein the light reflective layer is a patterned light reflective layer, and the patterned light reflective layer does not overlap with a polysilicon layer of the device layer.

7. The flexible device according to claim 1, further comprising a light absorbing film, wherein the light absorbing film is located above the light reflective layer or located below the light reflective layer.

8. The flexible device according to claim 7, wherein the light absorbing film is a multilayered structure, wherein the multilayered structure comprises stacked layers of different band gap materials.

9. The flexible device according to claim 7, wherein the light absorbing film has a band gap range between 1.1 eV~1.8 eV.

10. The flexible device according to claim 7, wherein the light absorbing film is located within the buffer layer and is separated from the light reflective layer.

11. The flexible device according to claim 7, wherein the light absorbing film is located within the buffer layer and is in contact with the light reflective layer.

12. The flexible device according to claim 7, wherein the light absorbing film is a patterned light absorbing film, and the patterned light absorbing film does not overlap with a gate electrode of the device layer or does not overlap with a polysilicon layer of the device layer.

13. The flexible device according to claim 7, wherein a material of the light absorbing film comprises amorphous Si, microcrystalline Si, Mo, Ti, Cr, W, Zr, V, Nb, Ta, Pt, Cu, Au, Zn, Cd, Al, Ag, C, Sn, or a combination thereof.

14. The flexible device according to claim 7, wherein the light reflective layer is a patterned light reflective layer and the light absorbing film is a patterned light absorbing film, the patterned light reflective layer and the patterned light absorbing film have the same pattern.

15. The flexible device according to claim 7, wherein the light reflective layer is a patterned light reflective layer and the light absorbing film is a patterned light absorbing film, the patterned light reflective layer and the patterned light absorbing film have different pattern.

16. The flexible device according to claim 1, wherein the light reflective layer comprises a metal layer, a stacked layer comprising a metal layer and a ceramic layer, a stacked layer comprising a first ceramic layer, a metal layer and a second ceramic layer, or a combination thereof.

17. The flexible device according to claim 1, wherein the metal material comprises Rh, Al, AlNd, Cu, Au, Ag, Al alloy, Rh alloy, or a combination thereof.

18. The flexible device according to claim 1, wherein the device layer comprises:
   a polysilicon layer comprising a source region, a drain region and a channel region located in between the source region and the drain region;
   a gate insulating layer located on the polysilicon layer; and
   a gate electrode located on the gate insulating layer.

19. The flexible device according to claim 1, further comprising a dielectric layer located on the device layer.

* * * * *